US006995444B2

(12) United States Patent
Cova et al.

(10) Patent No.: US 6,995,444 B2
(45) Date of Patent: Feb. 7, 2006

(54) ULTRASENSITIVE PHOTODETECTOR WITH INTEGRATED PINHOLE FOR CONFOCAL MICROSCOPES

(75) Inventors: Sergio Cova, Milan (IT); Franco Zappa, Sesto San Giovanni (IT); Massimo Ghioni, Monza (IT); Robert Grub, Heubach (DE); Eberhard Derndinger, Aalen (DE); Thomas Hartmann, Uffing A. Staffelsee (DE)

(73) Assignee: Carl Zeiss Jena GmbH, Jena (DE)

( * ) Notice: Subject to any disclaimer, the term of this patent is extended or adjusted under 35 U.S.C. 154(b) by 0 days.

(21) Appl. No.: 10/257,071

(22) PCT Filed: Apr. 9, 2001

(86) PCT No.: PCT/EP01/04008

§ 371 (c)(1),
(2), (4) Date: Mar. 24, 2003

(87) PCT Pub. No.: WO01/78153

PCT Pub. Date: Oct. 18, 2001

(65) Prior Publication Data

US 2003/0160250 A1 Aug. 28, 2003

(30) Foreign Application Priority Data

Apr. 10, 2000 (IT) .......................... MI2000A0765

(51) Int. Cl.
*H01L 31/107* (2006.01)
*H01L 29/861* (2006.01)
*H01L 31/06* (2006.01)

(52) U.S. Cl. ...................... 257/438; 257/481; 257/461; 257/463; 257/464

(58) Field of Classification Search ................ 257/438, 257/461, 463, 464, 481, 484
See application file for complete search history.

(56) References Cited

U.S. PATENT DOCUMENTS 3,534,231 A * 10/1970 Biard ......................... 257/438

(Continued)

FOREIGN PATENT DOCUMENTS

JP 58103180 A * 6/1993 ................. 257/461

OTHER PUBLICATIONS

A. Lacaita et al.: "Geranium quad-cell for single photon detection in the near infrared", Photodetectors and Power Meters II, San Diego, CA, USA, Jul. 11-12, 1995, vol. 2550, pp. 274-283, XP002179902, Proceedings of the SPIE—The International Society for Optical Engineerings, 1995, SPIE-Int. Soc. Opt. Eng, USA, ISSN: 0277-786X, figures 1, 2, 8, 9, p. 2, line 14 —p. 3, line 7; p. 6, line 11—p. 7.

(Continued)

*Assistant Examiner*—Samuel A. Gebremariam
(74) *Attorney, Agent, or Firm*—Wenderoth, Lind & Ponack, L.L.P.

(57) ABSTRACT

Photodetector device comprising a semiconductor substrate (1) of a first type of conductivity connected to a first electrode (2). Said substrate comprises an active area (4) made up of different semiconductor regions of a second type of conductivity (8, 9, 10) insulated from each other and connected to respective second electrodes (13, 14, 15) so that each of them can be connected separately from the others to an appropriate bias voltage. By regulating the bias voltages applied to these regions the function of optic diaphragm of the device can be controlled. The device works without needing any form of optical insulation between the different regions of the active area and always uses the same single output electrode for the signal in all the different situations of diaphragm adjustment.

6 Claims, 3 Drawing Sheets

U.S. PATENT DOCUMENTS

| | | | | |
|---|---|---|---|---|
| 4,127,932 A | | 12/1978 | Hartman et al. | |
| 5,360,987 A | * | 11/1994 | Shibib | 257/446 |
| 5,367,188 A | * | 11/1994 | Kudo | 257/461 |
| 5,382,824 A | * | 1/1995 | Popovic | 257/464 |
| 5,831,322 A | | 11/1998 | Dabrowski et al. | |

OTHER PUBLICATIONS

Patent Abstracts of Japan, vol. 1998, No. 14, Dec. 31, 1998 & JP 10 233525 A (Hamamatsu Photonics KK), Sep. 2, 1998.

Patent Abstracts of Japan, vol. 1995, No. 06, JUl. 31, 1995 & JP 07 074390 A (Nikon Corp), Mar. 17, 1995.

F. Zappa et al.: "Integrated array of avalanche photodiodes for single-photon counting", ESSDERC '97. Proceedings of the 27th European Solid-State Device Research Conference, 27th European Solid-State Device Research Conference (ESSDERC '97), Stuttgart, Germany, Sep. 22-24, 1997, pp. 600-603, XP002179903, 1997, Paris, France, Editions Frontieres, France, ISBN: 2-86332-221-4, Section I: Introduction, Section II: Design of the SPAD array.

A. Zanchi et al.: A Probe Detector for Defectivity Assessment in P-N Junctions: IEEE Transactions on Electron Devices, IEEE Inc. New York, US, vol. 47, No. 3, Mar. 2000, pp. 609-615, XP000947942, ISSN: 0018-9383, Figure 1, Section II: operating principles of the probe device.

* cited by examiner

ULTRASENSITIVE PHOTODETECTOR WITH INTEGRATED PINHOLE FOR CONFOCAL MICROSCOPES

BACKGROUND OF THE INVENTION

1. Feild of the Invention

The present invention refers to a photodetector device with high sensitivity and equipped with an adjustable micrometric diaphragm integrated in the photodetector device itself. More specifically it is a detector device suitable for use in confocal microscopes.

2. Description of the Art

Photodetector devices that enable optical signals to be measured are already known. There are cases in their application in which the information of interest is brought only by the light signal incident on a small well-defined area. In such cases a photodetector is required to generate an output signal only in correspondence with the arrival of the photons on that small area.

In particular in confocal microscopes a light detector apparatus is used which functions in the above mentioned manner and which in addition has a very high detection sensitivity, suitable for working with ultra-weak illumination intensity, in various cases even managing to detect single photons. To reach these high sensitivities it is necessary to use photodetectors, which also with ultra-weak illumination intensity supply electrical signals of level higher than the noise of the electronic circuits that process the signals themselves, so that the sensitivity is not limited by the noise of the circuits. Photodetector devices which are available with these characteristics are photomultiplier tubes (PMT), avalanche photodiodes that work in a similar way to an amplifier (Avalanche PhotoDiodes APD), and avalanche photodiodes that work in the Geiger mode (Single Photon Avalanche Diodes SPAD). The selection of the light that arrives at the photodetector device is obtained with a mechanical micrometric diaphragm with has an accurately defined diameter and position of the opening, placed in front of the photodetector itself.

In various cases it is also required that the area selected be adjustable so as to meet the various needs in the various phases of a same measurement or in a sequence of measurements that are made under different conditions. Typical cases in a confocal microscope are those in which it is necessary to detect the light signal coming from very small samples (also single molecules diluted in a fluid), which is difficult to do by using a very small diameter diaphragm. In these cases, a preliminary observation of the samples is necessary. Such a preliminary observation can be carried out by using a micrometric diaphragm with a larger diameter so as to collect the light from a greater observed volume. When the object being looked for has been identified, a narrower micrometric diaphragm is used so as to obtain a more precise measurement, thereby limiting the observation to a smaller and better defined volume. Nevertheless, this requires the use of an adjustable mechanical micrometric diaphragm, which implies an increase in size, complexity and cost for the detection apparatus, an increase that turns out to be particularly remarkable if the apparatus is made so that it can be controlled by the electronic control system of the microscope.

It is beneficial to avoid the use of electromagnetic actuators and mobile mechanical parts. Instead,it is beneficial to use a photodetector that has a sensitive area whose dimensions can be controlled only by electronic means and that has the required high sensitivity.

A solution to this problem can be found in the use of a photodetector which is equipped with a sensitive area divided into small parts (pixel), that is, an array detector or an image detector. Nevertheless, the presently available array detectors and the image detectors have characteristics which are not very suitable for the solution of the above-mentioned problem.

Among the photomultiplier tubes (PMT) in industrial production, types with the anode being subdivided into small areas are available, but these areas are not small enough and are separated by sizeable dead spaces, which significantly reduce the detection efficiency. In addition, these PMT have a high number of separate electrical outputs (one per pixel), which increase the complexity, overall dimension and cost of the electronic circuits for processing the signals.

Other types of PMT permit a detection of the optical impulses that are sensitive to the position of incidence within a detection area that is continuous, that is, without dead spaces. Nevertheless, such types of PMT are costly and cumbersome and require the use of complex electronic circuits for extracting the information concerning the position of incidence of the optical signal inside the sensitive area. These types of PMT can work at a high sensitivity level, even at single-photon detection level, but the maximum allowable counting rate of photons that are detected on the whole area is less than that reached by an ordinary PMT. This limitation reduces considerably the dynamic range of the measurement.

The APD arrays, which are also presently available from industrial production, show drawbacks similar to those of the above-mentioned PMT with segmented anode, to which it must be added that of having a multiplication gain that is not high (values from a few tens to a few hundreds), which is not uniform for the various pixels and which varies as the temperature varies.

The SPAD arrays, which in contrast to the above-mentioned detectors are not as yet available commercially and are a research objective, present the difficult problem of the optical cross-talk between pixels. This cross-talk is due to the optical emission by the avalanche current charge carriers in a pixel, which generates false photon detection signals in the adjacent pixels. In order to eliminate the optical cross-talk between the pixels, an efficient optical insulation of the pixels must be provided, but this present considerable technological manufacturing difficulties and also causes an increase of the dead spaces between the pixels and of the cost of production of the SPAD arrays.

From the U.S. Pat. No. 5,900,949, it appears that also CCD image detectors (Charge coupled devices) have been used for the stated purpose. These detectors are available from industrial production and have various interesting characteristics (good quantum detection efficiency, flexibility of use, etc.). However the CCD image detectors have no internal gain and therefore their sensitivity is definitely lower and it is not possible to detect single photons with them.

SUMMARY OF THE INVENTION

In view of the state of the technique described, the object of the present invention is to construct a photodetector device with integrated micrometric diaphragm suitable for use in confocal microscopes, and which has a simpler structure and is easier to use than existing devices and which is capable of measuring ultra-weak light intensities.

In accordance with the present invention, said object is reached by means of a photodetector device comprising a substrate of semiconductor of a first type of conductivity that is connected to a first electrode. The substrate comprises an active area, wherein the active area is made up of various semiconductor regions of a second type of conductivity which are electrically insulated from each other. The semiconductor regions of the active area of the substrate are each connected to respective second electrodes so that each of said second semiconductor regions of a second type of conductivity can be connected separately from the others to a suitable bias voltage.

The device, object of the present invention differs from an APD or SPAD array for various features that are essential for the purposes of the required operation.

In particular, in this device of the present invention, the dead spaces between the regions of the second type can be minimized. In fact the distance that separates the adjacent regions of the second type can be reduced to the bare minimum necessary to ensure electrical insulation between said regions, and therefore,the distance separating the adjacent region is much smaller than that which separates the pixels in APD and SPAD arrays. In fact, in the APD or SPAD arrays, the structure of the device between the various pixels is necessarily more complicated, both for electrical reasons (electrical guard rings are needed around the single pixels) and for optical reasons (optical insulation is needed between the pixels for avoiding the optical cross-talk).

According to the present advantageous effect of the present invention a high sensitivity photodetector device can be constructed which presents a sensitive area whose dimensions can be controlled electronically without coming across the problems met with the presently available types of photodetectors, in particular, the device of the present invention obviates the need to use micrometric diaphragms external to the detector.

The characteristics and advantages of the present invention will become more evident from the following detailed description of its embodiments thereof, which are illustrated as non-limiting examples in the accompanying drawings.

DETAILED DESCRIPTION OF THE INVENTION

Figure 1:
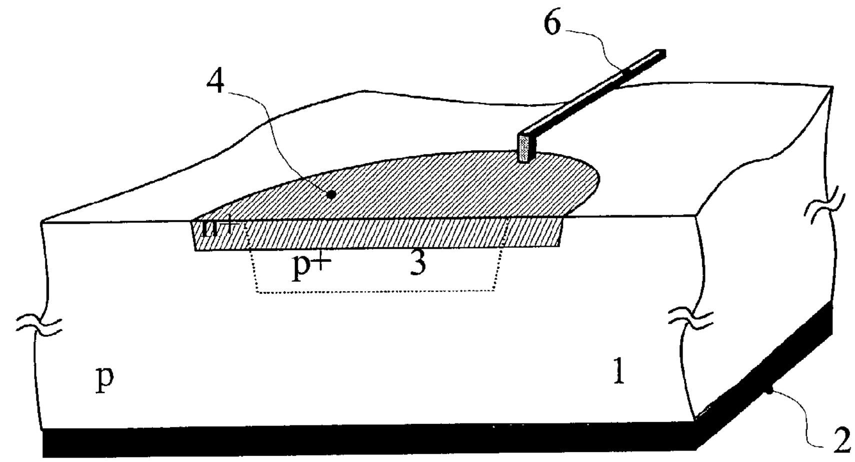
FIGS. 1 and 2 show perspective views of cross-sections of avalanche diodes according to the known technique and used as APD or SPAD photodetectors.
Figure 2:
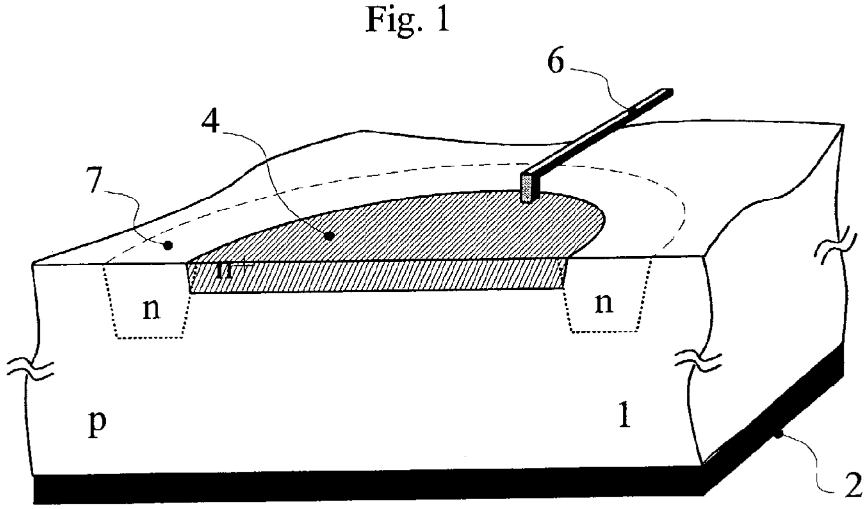

In FIGS. 1 and 2 perspective views are shown of the cross-sections of avalanche diodes according to the known technique. A substrate 1 of a P type semiconductor is connected in the lower part to a metallic electrode 2. A region 4 of N+ type semiconductor provided with an electrode 6 is placed on the upper part of the substrate 1. At the centre of FIG. 1 there is a P+ type region 3 which is not as wide as region 4 so that the electric field intensity on the edge of region 4 is not as high and the breakdown on the edge itself is avoided. In FIG. 2, the same result is obtained with an N type region 7 that surrounds region 4 and has a lower density of dopant than the region 4, whereby the region 7 constitutes an electrical guard ring. Electrode 6 acts as a cathode and electrode 2 as an anode. Alternatively, it is possible to interchange the P and N polarities of the regions of the semiconductor and to interchange the functions of cathode and anode of the said electrodes.

Figure 3:
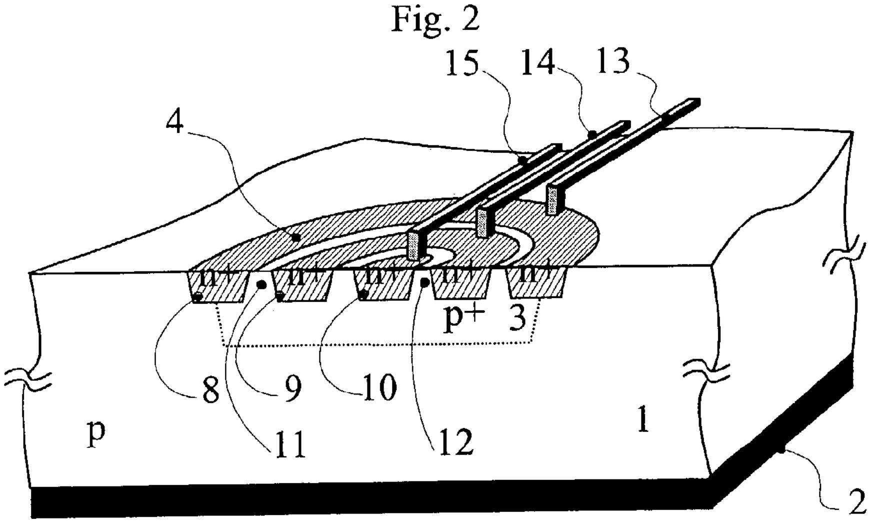
FIG. 3 shows a perspective view in of the cross-section of a photodetector device according to a first embodiment of the present invention.

FIG. 3 shows a perspective view of the cross-section of an avalanche diode according to a first embodiment of the present invention. In contrast to the avalanche diodes of FIGS. 1 and 2, region 4 is subdivide into small N+ type semiconductor regions 8, 9, 10 in the form of concentric rings which are separated from each other by means of portions 11, 12 of the P+ type semiconductor region 3. Each of the regions 8, 9, 10 are contacted by means of respective 13, 14, 15 electrodes separated from each other so that it is possible to independently control the bias voltage which is applied between each electrode of the regions 8, 9, 10 and the electrode 2.

Figure 4:
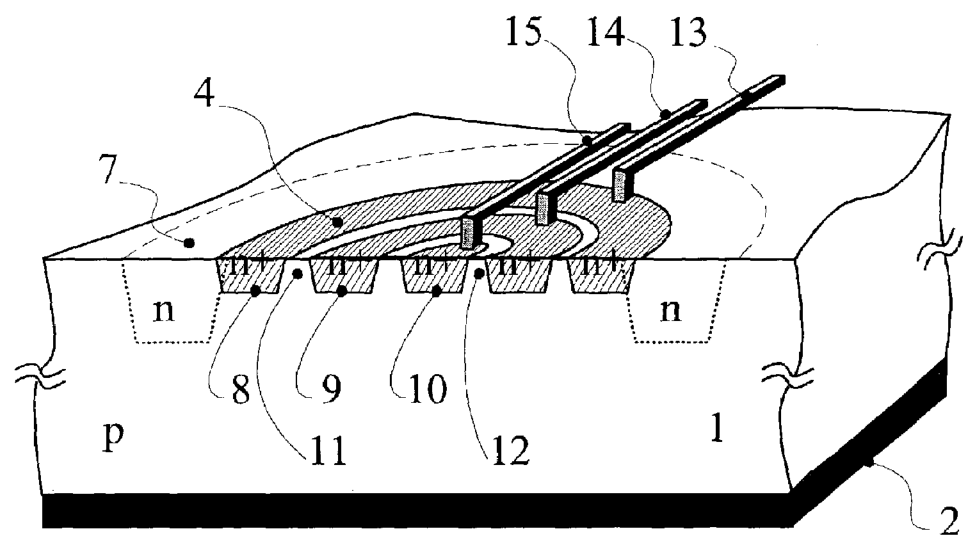
FIG. 4 shows a perspective view of the cross-section of a photodetector device according to a second embodiment of the present invention.

FIG. 4 shows a perspective view of the cross-section of an avalanche diode according to a second embodiment of the invention, which is different from that of FIG. 3 for the fact that the regions 8, 9, 10 of N+ type semiconductor in the form of concentric rings are separated from each other by means of portions 11, 12 of the P type substrate 1 and in addition an N type region 7 is present which surrounds region 4 and has a lower density of dopant than said region 4, so that it constitutes a guard ring.

Figure 5:
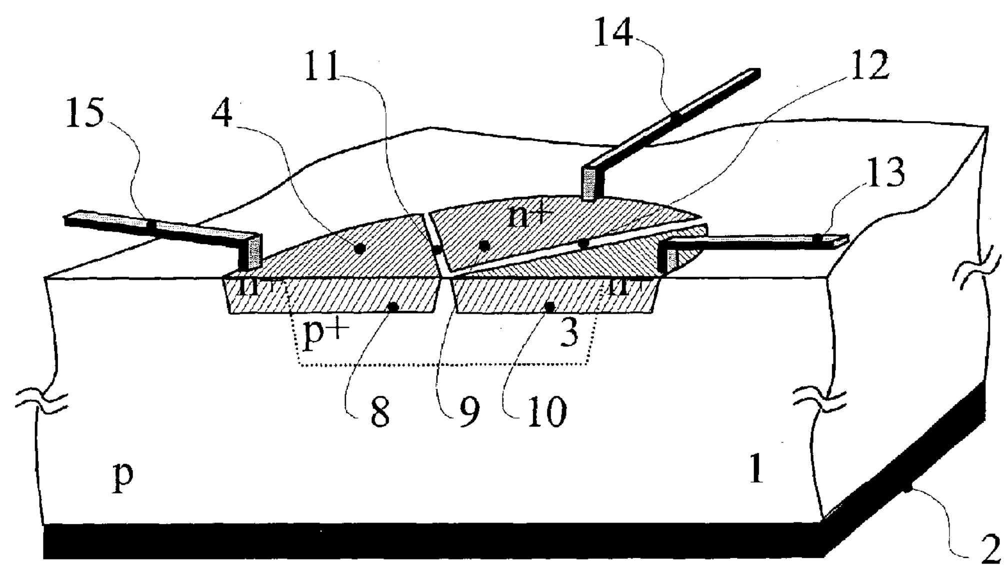
FIG. 5 shows a perspective view of the cross-section of the photodetector device according to a variant of the first embodiment of the present invention.
Figure 6:
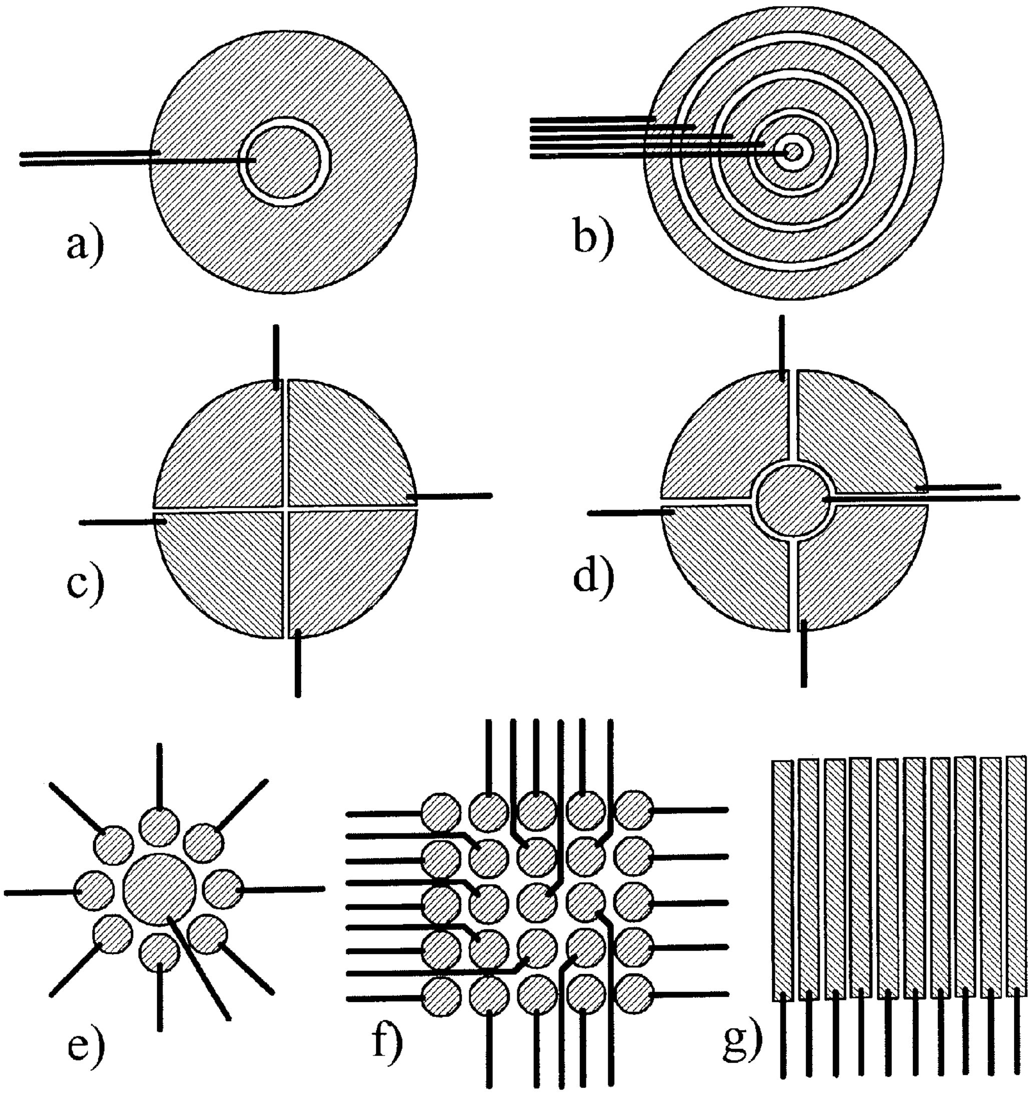
FIG. 6 schematically shows various possible geometries of the active areas of a photodetector device according to the present invention.

Several variants of the avalanche diodes shown in FIG. 3, mainly concerning the geometric form of the N+ type semiconductor regions, 8, 9, 10, are represented in FIGS. 5 and 6. In FIG. 5, the N+ type semiconductor regions have a sector shape while FIG. 6 shows the various forms that the same regions can take according to the possible uses of the avalanche diode: with two concentric rings (a); with more concentric rings (b); with four equal sectors (c); with different sectors (d); with circles (e); with circles of the same size (f); and with stripes (g). The above-mentioned variations of geometric forms of the N+ type semiconductor regions can also be made for the structure illustrated in FIG. 4.

The structure of the avalanche diode in accordance with the present invention finds application both in the case of APD devices and in the case of SPAD devices.

The APD devices are avalanche diodes which have internal linear amplification with an internal gain of a different value according to the value of the bias voltage. In fact, if the inverse bias voltage is kept well below the avalanche breakdown voltage of the diode, there is no multiplication and a single photon generates only one electron-hole pair, which is simply collected; therefore the diode works without amplifying the photogenerated current, that is with unitary gain of current. On the other hand, when the bias voltage is brought close to the breakdown voltage, but still remains lower than the breakdown voltage, the avalanche multiplication phenomenon is obtained, and therefore a single photon triggers a chain generation of electron-hole pairs which amplifies the current due to the primary photogenerated carriers, producing a much greater current at the output of the diode. The diode thus works with a gain of current much higher than the unit, which gradually increases as the bias voltage comes closer to breakdown voltage, but still remains lower than the breakdown voltage.

SPAD devices, which represent the preferred use of the avalanche diode according to the invention, have a different operation mode according to the value of the bias voltage. In fact, if the bias voltage stays well below the value of the avalanche breakdown voltage, there is no multiplication and a single photon generates only one electron-hole pair, thereby producing a microscopic current pulse. The pulse cannot be detected by an electronic circuit because the pulse is much smaller than the noise of the circuit itself. When the bias voltage is higher than the avalanche breakdown voltage, the SPAD diode operates in the Geiger mode and a single photon absorbed by the diode generates an electron-hole pair, which triggers a phenomenon of self-sustaining avalanche multiplication, thereby producing a pulse of current of considerable level, well above that of the noise in the electronic circuits. The pulse can be easily detected, processed and used in circuits, such as pulse comparator circuits and pulse counter circuits.

The structure of the avalanche diode according to the present invention permits a new method for the detection of the optic signal.

The light signal impinges on the active area of the diode which in the case of the devices of FIGS. 3 and 4 is constituted by the array of the N+ type semiconductor regions 8, 9, 10 separate from each other.

Among these N+ type semiconductor regions, a bias voltage that is low enough to prevent the phenomenon of avalanche multiplication from occurring is applied to those regions that must be kept shielded from the action of the optical signal, where such regions are called inhibited areas. In the case of the APD device, the voltage must be sufficiently lower than the breakdown voltage so as to prevent the amplification of the signal. In the case of SPAD devices, the voltage must be lower than the breakdown voltage.

A bias voltage is applied to those N+ type semiconductor regions that instead must be sensitive to the incident signal, where such regions are called enabled areas, which is high enough to guarantee that the phenomenon of avalanche multiplication occurs with sufficiently high intensity so as to permit the detection and processing of the signal by a circuit (not visible) connected to the output electrode 2. More precisely, in the case of APD devices, the voltage must be lower than the breakdown voltage and close enough to the breakdown voltage so as to guarantee a high current gain. Conversely, in the case of SPAD devices, the voltage must be higher than the breakdown voltage and sufficient to ensure the operation of the diode in Geiger mode.

A characteristic of the device of the present invention that differentiates it from the APD or SPAD array devices is that in all the working configurations, that is, irrespective of the choice of the voltages that are applied and therefore irrespective of the selection of the enabled areas, the output signal of the photodetector device is supplied by the same single electrode. The preferred choice for the output electrode is that of the electrode 2. An alternative choice is an electrode which is connected to an N+ zone that, in the working conditions of the device, is always enabled, since such electrode is comprised in the minimum enabled area used. As a non-limiting example of this second choice, in the devices of FIGS. 3 and 4, the electrode 15 which is connected to the zone 10 that is situated at the centre of the active area may be taken as output electrode.

What is claimed is:

1. A photodetector device comprising:

a semiconductor substrate of a first type of conductivity;

a first electrode connected to said semiconductor substrate;

a plurality of second electrodes; and an active region of a second type of conductivity, said active region being formed on a surface of said semiconductor substrate, said active region being operable to receive an optical signal to be detected, and said active region being comprised of a plurality of semiconductor sub-regions of the second type of conductivity which are electrically insulated from each other by portions of said semiconductor substrate and which are independently connected to said plurality of second electrodes, respectively;

wherein each of said plurality of second electrodes is separated from each other, and an independently controlled selectable bias voltage is respectively applied between each of said plurality of second electrodes and said first electrode so as to be able to produce avalanche multiplication of charge carriers under the corresponding semiconductor sub-regions and a resulting electrical output signal which is indicative of the optical signal to be detected.

2. The device according to claim 1, further comprising another semiconductor region of the first type of conductivity with a high dopant density, said another semiconductor region being provided under said active region.

3. The device according to claim 2, wherein the width of said another semiconductor region is smaller than the width of said active region.

4. The device according to claim 1, wherein a ring-shaped semiconductor region of the second type of conductivity with a lower dopant density than a dopant density of said semiconductor sub-regions of the second type of conductivity of said active region is provided around said active region.

5. The device according to claim 1, wherein said semiconductor sub-regions of said active region have the shape of concentric rings.

6. The device according to claim 1, wherein said semiconductor sub-regions of said active region have the shape of circumference sectors.

* * * * *